United States Patent
Kufahl et al.

(10) Patent No.: US 10,582,645 B1
(45) Date of Patent: Mar. 3, 2020

(54) COOLING APPARATUS FOR ELECTRONIC COMPONENTS

(71) Applicant: HEWLETT PACKARD ENTERPRISE DEVELOPMENT LP, Houston, TX (US)

(72) Inventors: Benjamin Kufahl, Chippewa Falls, WI (US); Harvey Lunsman, Chippewa Falls, WI (US); Michael Scott, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/145,625

(22) Filed: Sep. 28, 2018

(51) Int. Cl.
H05K 7/20 (2006.01)
F28D 15/02 (2006.01)
H05K 1/02 (2006.01)

(52) U.S. Cl.
CPC ..... *H05K 7/20454* (2013.01); *F28D 15/0233* (2013.01); *F28D 15/0275* (2013.01);
(Continued)

(58) Field of Classification Search
CPC ............. H01L 23/473; H05K 7/20772; H05K 7/20809; H05K 7/20781; H05K 7/20254; H05K 7/2079; H05K 7/20272; H05K 7/20509; H05K 7/20327; H05K 7/20218; H05K 7/2039; H05K 1/0203; H05K 1/0272; H05K 7/20763; G06F 1/20; G06F 2200/201; G06F 1/203
See application file for complete search history.

(56) References Cited

U.S. PATENT DOCUMENTS 4,997,032 A 3/1991 Danielson et al.
5,245,508 A * 9/1993 Mizzi ................. H05K 7/20636
165/185

(Continued)

OTHER PUBLICATIONS

Arthur K. Farnsworth, Integrated Heat Pipe Spreader for Improved FBDIMM Memory Module Thermal Management, Nov. 1, 2008, pp. 1-10 (online), ITEM Media, Retrieved from the Internet on May 25, 2018 at URL: <electronics-cooling.com/2008/11/integrated-heat-pipe-spreader-for-improved-fbdimm-memory-module-thermal-management/#>.

(Continued)

*Primary Examiner* — Adam B Dravininkas
(74) *Attorney, Agent, or Firm* — Nolte Intellectual Property Law Group

(57) ABSTRACT

A cooling apparatus includes a plurality of containers and a plurality of connectors. Each connector connects adjacent containers of the plurality of containers. The cooling apparatus is installable in a computing device such that each electronic component to be cooled in the computing device is interposed between adjacent containers. Each container may include a body, an inlet, and an outlet. The body may include first and second ends and may define a chamber through which a coolant is to flow. The body may be expandable responsive to pressure from the coolant and deformable responsive to contacting one of the electronic components so as to conform to a profile of the electronic component. The inlet may be disposed at the first end of the body through which the coolant enters the chamber. The outlet may be disposed at the second end of the body through which the coolant exits the chamber.

8 Claims, 11 Drawing Sheets

(52) U.S. Cl.
CPC ....... *H05K 1/0204* (2013.01); *H05K 7/20254* (2013.01); *H05K 7/20781* (2013.01); *H05K 2201/066* (2013.01)

(56) References Cited

U.S. PATENT DOCUMENTS

| | | | | |
|---|---|---|---|---|
| 5,404,270 | A * | 4/1995 | Carlstedt | H05K 7/20254 165/104.33 |
| 5,560,423 | A | 10/1996 | Larson et al. | |
| 5,740,018 | A * | 4/1998 | Rumbut, Jr. | H05K 7/20563 165/46 |
| 7,063,127 | B2 * | 6/2006 | Gelorme | H01L 23/433 165/185 |
| 7,106,595 | B2 | 9/2006 | Foster, Sr. et al. | |
| 7,167,366 | B2 | 1/2007 | Cheon et al. | |
| 7,286,355 | B2 | 10/2007 | Cheon | |
| 7,581,585 | B2 | 9/2009 | Tuma et al. | |
| 7,965,509 | B2 | 6/2011 | Campbell et al. | |
| 8,004,841 | B2 | 8/2011 | Cipolla et al. | |
| 8,215,377 | B1 * | 7/2012 | Monson | F28D 15/02 165/104.21 |
| 9,158,348 | B2 | 10/2015 | Berk et al. | |
| 9,245,820 | B2 | 1/2016 | Goldrian et al. | |
| 9,900,973 | B2 | 2/2018 | Matsumoto et al. | |
| 2004/0160745 | A1 * | 8/2004 | Aizawa | G06F 1/184 361/748 |
| 2006/0098409 | A1 * | 5/2006 | Cheon | G06F 1/20 361/699 |
| 2008/0024997 | A1 * | 1/2008 | Ghantiwala | G06F 1/20 361/719 |
| 2009/0120607 | A1 * | 5/2009 | Cheon | H05K 7/20254 165/46 |
| 2010/0252234 | A1 * | 10/2010 | Cambell | H01L 23/473 165/80.2 |
| 2012/0020004 | A1 * | 1/2012 | Rau | G06F 1/20 361/679.31 |
| 2016/0136851 | A1 * | 5/2016 | Campbell | H05K 7/20436 264/279 |
| 2016/0165748 | A1 * | 6/2016 | Chen | B23P 15/26 165/46 |

OTHER PUBLICATIONS

AT&T; "Universal Ram Module Water Cooling Set for 4 Banks 4-DIMMs V2"; printed from: http://www.att-distribution.com/our-products/water-block/memory-block/universal-ram-module-water-cooling-set-for-4-banks-4-dimms-v2.html#.WjdSWVWWYdU on Dec. 21, 2017; 2 pages.

* cited by examiner

COOLING APPARATUS FOR ELECTRONIC COMPONENTS

BACKGROUND

Electronic components (e.g., processing and memory components) included in computing devices, such as servers, generate heat during their operation. Accordingly, to prevent damage to the electronic components, cooling systems have been implemented in many computing devices to maintain the electronic components at acceptable operational temperatures. Generally, cooling systems may utilize a cooling fluid to absorb thermal energy from the electronic components. In some instances, the cooling fluid may be a gas, such as air, and may directly contact the electronic components) to transfer thermal energy from the electronic component(s) to the cooling fluid. In other instances, the cooling fluid may be a liquid, such as water or oil, and may be brought into thermal contact with the electronic component(s) via one or more cooling blocks or piping.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
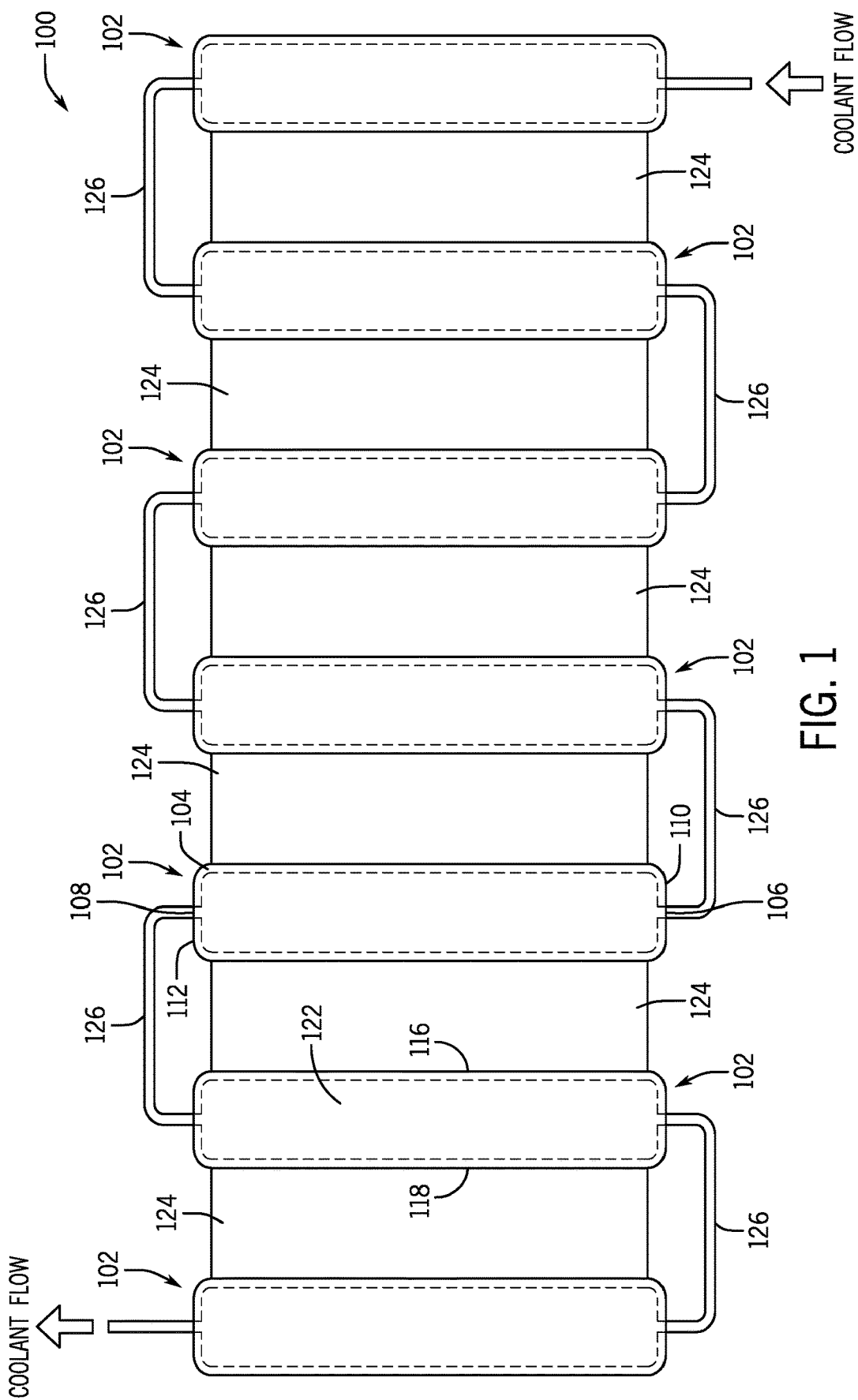
FIG. 1 is a plan view of a cooling apparatus, according to one or more examples of the disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10% unless otherwise expressly specified. Moreover, examples herein are intended to be illustrative only and are presented for discussion purposes and not by way of limitation.

As central processing units (CPUs), graphical processing units (GPUs), and other electronic components (e.g., memory devices) decrease in size, computing devices, such as servers, are in turn able to increase the number of such electronic components utilized. Likewise, server racks, such as high-density server racks, have been constructed to house an increased number of servers for certain computing applications. Established air-cooling systems, such as computer room air conditioner (CRAC) units, typically are not able to provide a sufficient cooling air flow through the high-density server racks. In addition, generating sufficient air flow via a forced air method may lead to excessive energy consumption by the fans and/or compressors generating the forced air.

Thus, liquid cooling may be implemented in such environments to utilize the naturally high heat absorption of liquids. In one implementation, liquid cooling may be carried out through the use of cooling blocks containing a liquid coolant placed in thermal contact with the electronic components to be cooled. Such cooling blocks are typically made of rigid materials, such as metals, and may be challenging to place in sufficient contact with the electronic components to transfer thermal energy due to the uneven surfaces or profiles of the electronic components. In such cases, the cooling efficiency of the cooling blocks is reduced and additional cooling blocks or other cooling methods may be implemented to maintain the electronic components at appropriate operating temperatures.

Although effective in some instances, liquid cooling utilizing cooling blocks may be ineffective in the cooling of electronic components in some server implementations. For example, in the case of twinned server blades (i.e., server blades having an identical construction), the server blades are oriented in the server rack facing one another with their respective electronic components (e.g., dual inline memory modules (DIMMs)) interleaved with one another, to optimize space in the server rack. Accordingly, in such an arrangement, cooling blocks may not be practical for use in cooling the DIMMs based on space constraints. For example, the use of cooling blocks and the accompanying mounting structure is dependent on providing increased spacing between the DIMMs, which is typically not feasible, as useful computing resources would typically be omitted to provide the increased spacing. Additionally, increasing the number of cooling blocks contributes to the expense and weight of the server blades and the racks in which the server blades are disposed.

Examples of the present disclosure are directed to cooling apparatus and computing devices including cooling apparatus capable of cooling electronic components and addressing the drawbacks of the aforementioned cooling systems and methods. Particularly, in one or more examples of the present disclosure, a cooling apparatus is provided that is capable of cooling electronic components, such as DIMMs, in a computing device. In some implementations, electronic components may be interleaved with one another in a twinned server blade configuration.

Through the use of deformable materials, such as, for example, soft plastics, the cooling apparatus may be lightweight and flexible and may include a plurality of containers connected with one another via one or more connectors. Each container may be configured to expand in response to a liquid coolant flowing therethrough and may be deformable to conform to the profile of an electronic component (e.g., DIMM) in contact with the container. The capability of the containers to conform to the profile of the electronic components allows for a larger contact area between the container and the electronic component, thereby increasing the transfer of thermal energy from the electronic component to the liquid coolant in the container.

In one example, each container may conform to the profile of the electronic component in contact with the container such that the container contacts greater than fifty percent of the surface area of the side of the electronic component in contact with the container. In another example, each container may conform to the profile of the electronic component in contact with the container such that the container contacts greater than sixty percent of the surface area of the side of the electronic component in contact with the container. In another example, each container may conform to the profile of the electronic component in contact with the container such that the container contacts greater than seventy percent of the surface area of the side of the electronic component in contact with the container. In another example, each container may conform to the profile of the electronic component in contact with the container such that the container contacts greater than eighty percent of the surface area of the side of the electronic component in contact with the container. In another example, each container may conform to the profile of the electronic component in contact with the container such that the container contacts greater than ninety percent of the surface area of the side of the electronic component in contact with the container.

In an implementation involving twinned served blades in which complementary (e.g., identical) server blades are oriented facing one another and one server blade has DIMMs interleaved with the DIMMs of the other server blade, the cooling apparatus may be positioned between the interleaved DIMMs in a serpentine shape such that each DIMM is interposed between adjacent containers of the cooling apparatus. A cooling system including the cooling apparatus may circulate a liquid coolant through each container, thereby transferring heat from each of the DIMMs to the liquid coolant in the respective containers contacting the DIMMs.

More particularly, in one example of the present disclosure, a cooling apparatus installable in a computing device to cool electronic components of the computing device is provided and may include a plurality of containers and a plurality of connectors. Each connector may connect adjacent containers of the plurality of containers. The plurality of containers may be positioned in the computing device such that each electronic component to be cooled is interposed between adjacent containers. Each container may include a body, an inlet, and an outlet. The body may include a first end and a second end and may define a chamber through which a coolant is to flow. The body may be expandable responsive to pressure from the coolant and deformable responsive to contacting one of the electronic components so as to conform to a profile of the electronic component. The inlet may be disposed at the first end of the body through which the coolant enters the chamber. The outlet may be disposed at the second end of the body through which the coolant exits the chamber.

In another example of the present disclosure, a computing device is provided and may include a first printed circuit board, a first plurality of electronic components, and a cooling apparatus to cool the first plurality of electronic components. The first plurality of electronic components may be operably connected to and extending from the first printed circuit board. Each electronic component may include a first end adjacent the first printed circuit board and a second end distal the first printed circuit board. The cooling apparatus may include a plurality of containers and a plurality of connectors. Each connector may connect adjacent containers of the plurality of containers. The plurality of containers may be positioned in the computing device such that each electronic component to be cooled is interposed between adjacent containers. Each container may include a body, an inlet, and an outlet. The body may include a first end and a second end and may define a chamber through which a coolant is to flow. The body may be expandable responsive to pressure from the coolant and deformable responsive to contacting one of the electronic components so as to conform to a profile of the electronic component. The inlet may be disposed at the first end of the body through which the coolant enters the chamber. The outlet may be disposed at the second end of the body through which the coolant exits the chamber.

In another example of the present disclosure, a method is provided for cooling a plurality of electronic components of a computing device. The method may include interposing each electronic component of the plurality of electronic components between adjacent containers of a plurality of containers. Each container may be connected to an adjacent container via a connector. The method may also include flowing a coolant through each of the containers, such that each of the containers expands and deforms to conform to a profile of the electronic component in contact with the respective container. The method may further include transferring heat from each electronic component to the coolant in the respective container in contact with the electronic component, thereby cooling the plurality of electronic components.

Turning now to the drawings, FIG. 1 is a plan view of a cooling apparatus 100, according to one or more examples of the disclosure. In one or more implementations, the cooling apparatus 100 may be utilized to cool a plurality of electronic components in a computing device. For example, cooling apparatus disclosed herein may be utilized to cool electronic components including, but not limited to, CPUs, GPUs, and memory devices, such as DIMMs. Computing devices incorporating such electronic components and the cooling apparatus may be, for example, servers, and in particular, may be server blades. Example server blades may include complementary server blades in which each server blade of the complementary server blades may be oriented to face the other server blade and may include DIMMs interleaved with the DIMMs of the other served blade. In some examples, the complementary server blades may be twinned (i.e., identical to one another). Twinned server blades are often advantageous for reducing manufacturing costs, and as oriented in such a manner in a server rack, provide for a reduced footprint and further allow for the twinned server blades to utilize a shared cooling system.

As illustrated in FIG. 1, the cooling apparatus 100 includes a plurality of containers 102 configured to expand in response to pressure from a coolant flowing therethrough. The container 102 may be a pouch, a bag, a bladder, or any other like component that is flexible/deformable and that is able to contain the coolant therein. To that end, each container may include a body 104 defining a chamber 122, at least one inlet 106, and at least one outlet 108 forming a flow path for the coolant to flow therethrough.

The body 104 may include a first end 110 and a second end 112 opposing the first end 110 along a longitudinal axis of the body 104. The body 104 may further include a first side 116 extending between the first end 110 and the second end 112, and a second side 118 extending between the first end 110 and the second end 112 and opposing the first side 116 along a lateral axis of the body 104. The chamber 122 defined by the body 104 may extend longitudinally between the first end 110 and the second end 112 and laterally between the first side 116 and the second side 118. The chamber 122 may be configured to receive the coolant from the inlet 106 and to discharge the coolant via the outlet 108. The body 104 may be deformable in response to contacting an electronic component so as to conform to a profile of the electronic component in contact with the body 104 to facilitate heat transfer between the coolant flowing therethrough and the electronic component. When it is said herein that the body 104 conforms to a profile of the electronic component, this does not mean that the body 104 perfectly conforms to the profile. That is, the body 104 conforms to the profile if the body 104 deforms in response to the profile so as to increase the area of surface contact between the body 104 and the electronic component, even if the body 104 does not make contact with every surface of the electronic component in every nook and cranny.

The body 104 may be made of any material that is capable of deforming in the manner described herein and that is capable of forming the liquid-tight chamber 122. For example, the material constituting the body 104 may be or include a soft plastic or polymer, meaning a plastic or polymer whose glass transition temperature is lower than about 20° C., such as for example softened polyvinyl chloride (PVC). As another example, the material constituting the body 104 may be or include silicon. As another example, the material constituting the body 104 may be or include a laminated polymer/metal foil combination. In some circumstances, it may be desirable for the material constituting the body 104 may be as thin as possible while still ensuring that the container remains liquid tight, to improve the heat transfer from the electronic component and the coolant. For example, if the body 104 is made from softened PCV, it may be desirable for the walls of the body 104 that are to contact the electronic component to be between about 0.004 inches (0.1 mm) and about 0.006 inches (1.5 mm) thick.

As illustrated in FIG. 1, each container 102 includes a single inlet 106 disposed at the first end 110 of the container 102 and a single outlet 108 disposed at the second end 112 of the container 102. However, it will be appreciated that the present disclosure is not limited thereto, and in other examples, each or at least one of the containers 102 may have a plurality of inlets 106. Likewise, in some examples, each or at least one of the containers 102 may have a plurality of outlets 108.

In each container, the inlet(s) 106 and outlet(s) 108 may be fluidly coupled to the chamber 122 to permit the coolant to flow therethrough. Although not shown, in some examples, the chamber 122 may be partitioned to form respective fluid passageways. In such examples, each fluid passageway may be fluidly coupled to a respective inlet 106 and outlet 108 isolated from the other fluid passageways. A filler (not shown), such as a sponge or the like, may be disposed in the chamber 122, or in each fluid passageway if partitioned, and may provide a circulation space for the coolant and to obtain contact elasticity. In some examples, the chamber 122 may be liquid tight except for the inlet 106 and outlet 108. In other words, the body 104 may be configured such that the coolant does not escape the chamber 122 except via the inlet 106 and/or the outlet 108.

The cooling apparatus 100 may further include a plurality of connectors 124 as shown in FIG. 1. Each connector 124 may extend between and connect adjacent containers 102 of the plurality of containers 102. In one or more examples, each connector 124 may couple a second side 118 of a container 102 to a first side 116 of an adjacent container 102. When the cooling apparatus 100 is installed between the electronic components, the first sides 116 and second sides 118 of the containers 102 are located at the top or bottom of the containers 102, as illustrated in FIGS. 3-10. When installed between the electronic components, the containers 102 alternate between having their first side 116 located at the top and having their first side 116 located at the bottom, and vice-versa for their second sides 118. In some examples, the connectors 124 may be flexible, allowing the cooling apparatus 100 to change its shape, which may make it easier to get the cooling apparatus 100 to form a serpentine shape as disposed in the computing device to effectively cool the electronic components. For example, the connectors 124 may be made from one of the deformable materials described above in relation to the body 104. In some examples, the connectors 124 and the body 104 may be made from the same material as one another.

In one example, the cooling apparatus 100 may be constructed from two sheets of deformable material, where the peripheries of the containers 102 and the portions of the sheets extending between each container 102 are hermetically sealed, such that the unsealed portions of the sheets within the peripheries form the chambers 122 of the respective containers 102. In such an example, the containers 102 and the connectors 124 are constructed from the same material. In other examples, each container 102 may be formed separately from the peripheries of two elastic sheets being hermetically sealed and the connectors 124 may be subsequently connected to the containers 102. Accordingly, in such an example, the connectors 124 may be the same or a different material as the body 104. In other examples, the containers 102 may be formed by injection molding, blow molding, stretch blow molding, or the like.

As shown in FIG. 1, the cooling apparatus 100 may further include a plurality of conduits 126. Each conduit 126 may connect the inlet 106 of one container 102 to the outlet 108 of an adjacent container 102 such that chambers 122 of the plurality of containers 102 are all communicably connected in series with one another. Thus, in this example, coolant enters the cooling apparatus 100 from the inlet 106 of a first one of the containers 102 in the series and flows through each of the containers in order until exiting the cooling apparatus 100 via the outlet 108 of a last one of the containers 102.

As shown in FIG. 1, each conduit 126 forms a U-shape; however, other shapes may be contemplated without departing from the scope of the present disclosure. In some examples, each conduit 126 may be constructed from the same material as the containers 102. In some examples, each inlet 106 may be integral with a respective conduit 126. In some examples, each outlet 108 may be integral with a respective conduit 126. In yet other examples, each inlet 106, outlet 108, and respective conduit 126 may be integral with one another.

Figure 2:
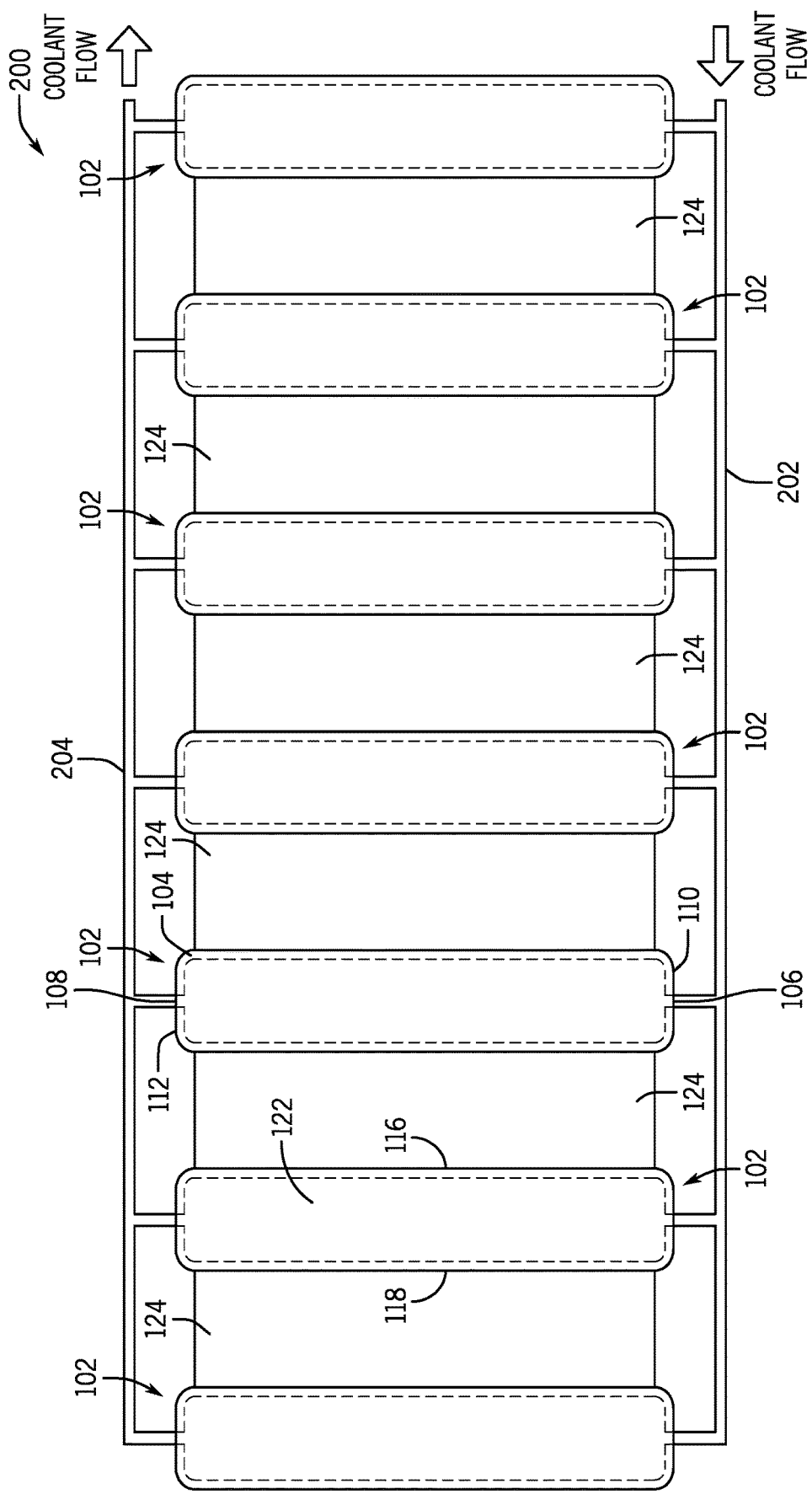
FIG. 2 is a plan view of a cooling apparatus, according to one or more examples of the disclosure.

FIG. 2 is a plan view of a cooling apparatus 200, according to one or more examples of the disclosure. The cooling apparatus 200 may be similar in some respects to the cooling apparatus 100 of FIG. 1, and thus, like numbers will be used to refer to like parts and the discussion of similar features will be omitted for the sake of brevity. In the implementation shown in FIG. 2, the plurality of containers 102 are communicatively connected in parallel with one another, rather than in series as was the case in the example of FIG. 1.

To that end, the cooling apparatus 200 includes an inlet manifold 202 and an outlet manifold 204 used in place of the plurality of conduits 126 illustrated in FIG. 1. The inlet manifold 202 may be connected to the respective inlets 106 of the plurality of containers 102 and may serve to distribute coolant received from a coolant source (not shown) to each of the containers 102. The outlet manifold 204 may be connected to the respective outlets 108 of the plurality of containers 102 and may serve to channel the coolant from each of the containers 102 to a single flow path (not shown) directed back to the coolant source. As arranged with reference to the inlet manifold 202 and the outlet manifold 204, the chambers 122 of the plurality of containers 102 may be communicably connected in parallel with one another.

Figure 3:
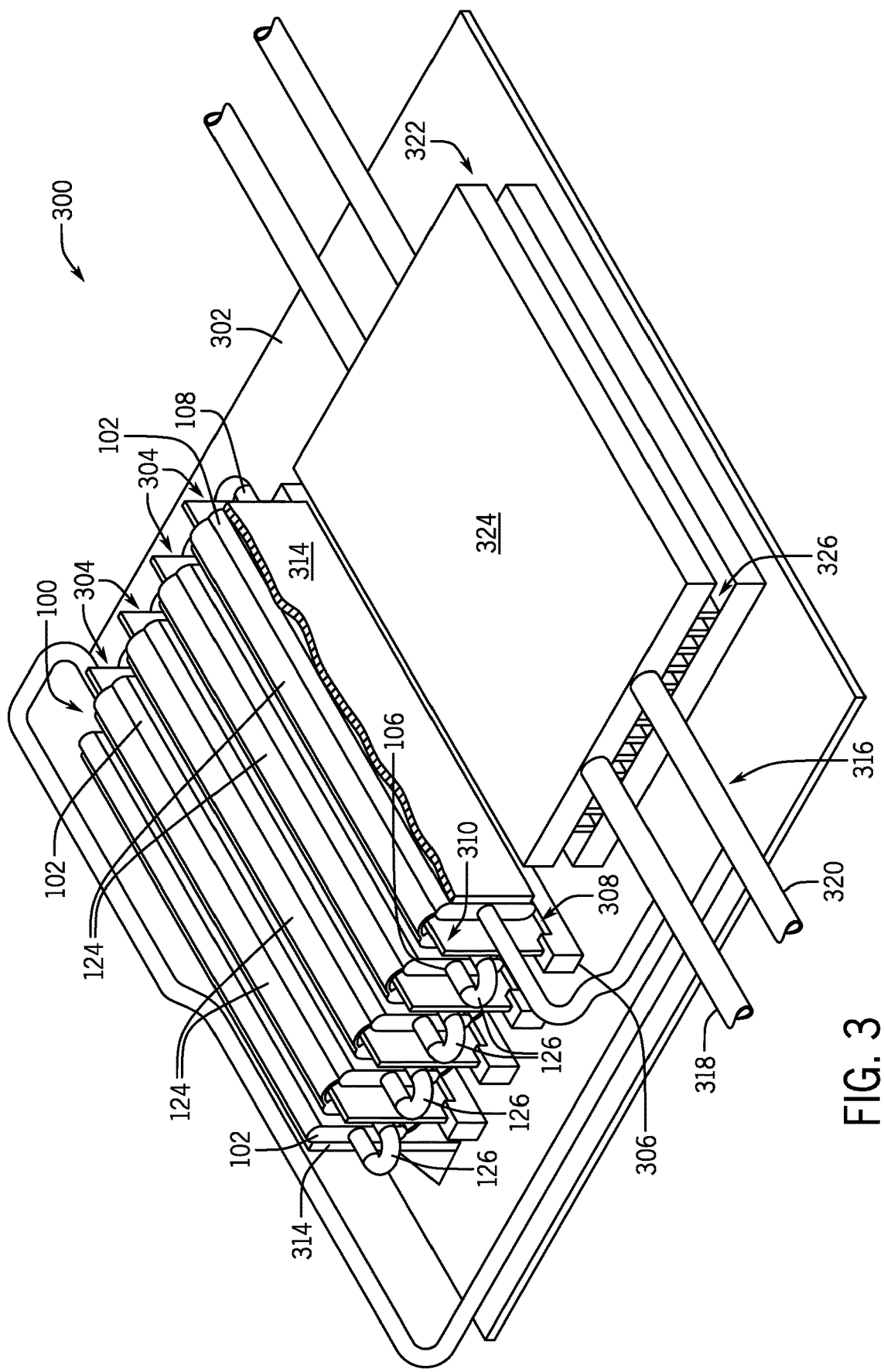
FIG. 3 is an isometric view of a computing device including the cooling apparatus illustrated in FIG. 1, according to one or more examples of the disclosure.
Figure 4:
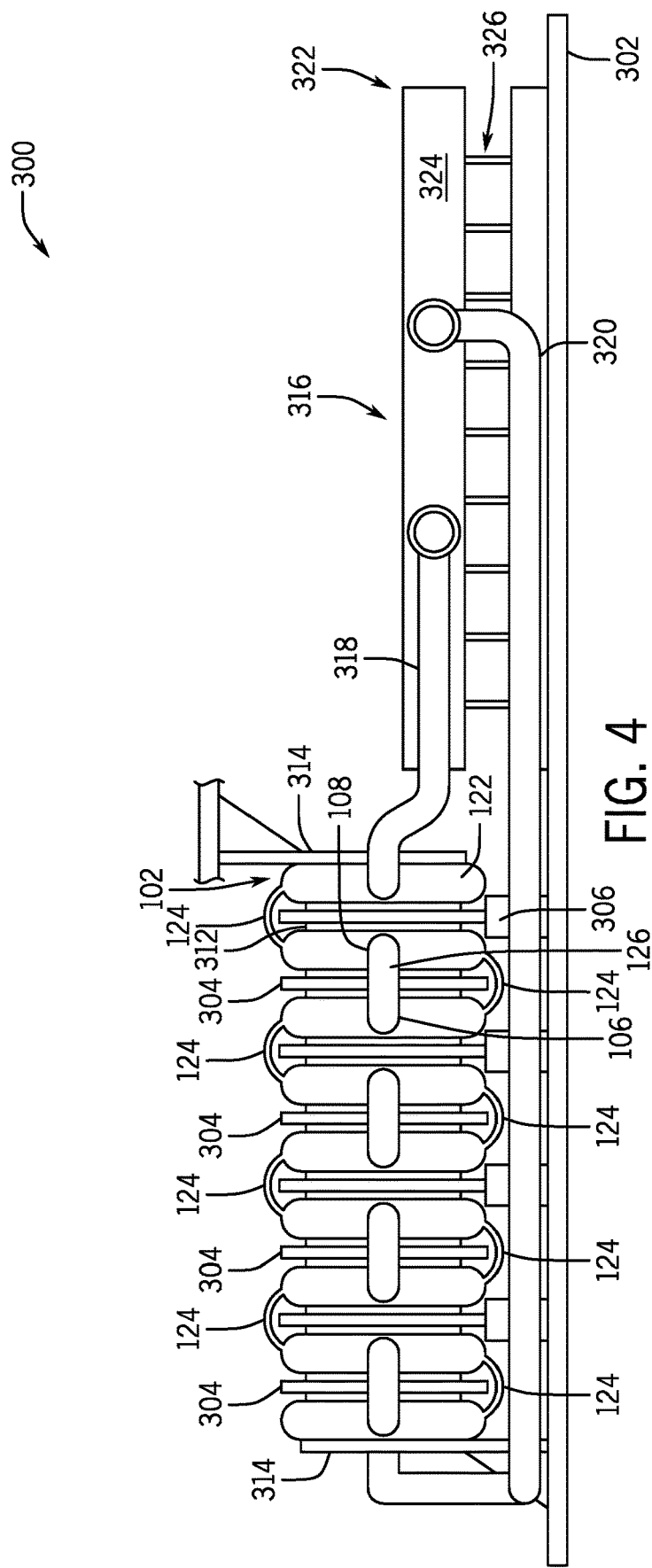
FIG. 4 is a front view of the computing device of FIG. 3, according to one or more examples of the disclosure.
Figure 5:
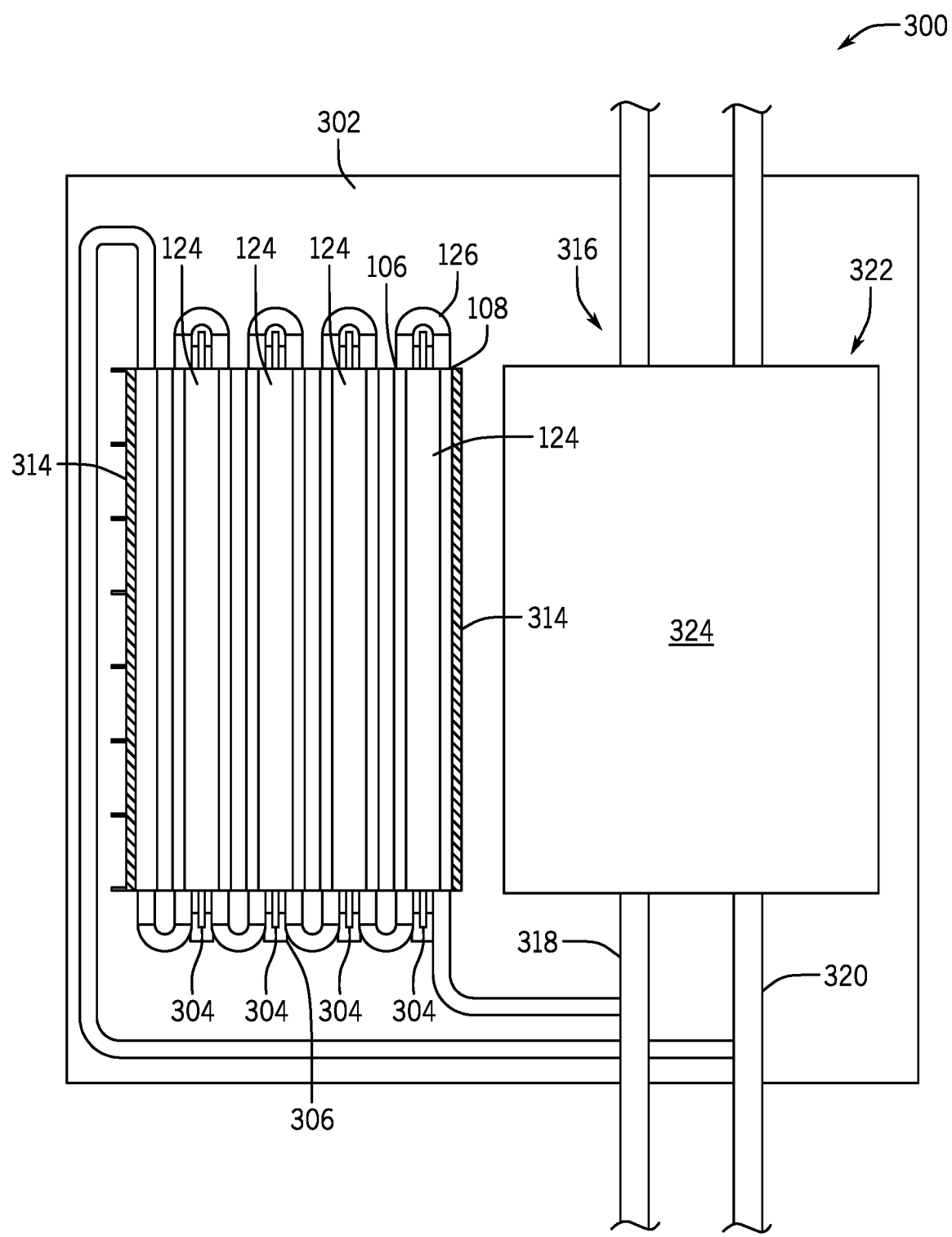
FIG. 5 is a plan view of the computing device of FIG. 3, according to one or more examples of the disclosure.

Referring now to FIGS. 3-5 with continued reference to FIG. 1, FIGS. 3-5 are respective isometric, front, and plan views of an example computing device 300 including a cooling apparatus installed therein, according to one or more examples of the disclosure. In one or more examples, the computing device 300 may include the cooling apparatus 100 illustrated in FIG. 1, and thus, like numbers will be used to refer to like parts and the discussion of similar features will be omitted for the sake of brevity. The computing device 300 may be a server blade including a printed circuit board 302 and a plurality of electronic components 304 operably connected to and extending from the printed circuit board 302. Each electronic component 304 may be operably connected to the printed circuit board 302 via a respective connecting member 306 and many include a first end 308 adjacent the printed circuit board 302 and coupled to the connecting member 306, and a second end 310 distal the printed circuit board 302.

As shown in FIGS. 3-5, each of the electronic components 304 is a DIMM. In other implementations, one or more of the electronic components 304 may be a CPU, a GPU, or like component. Each of the electronic components 304 includes a plurality of integrated circuits 312 (most clearly seen in FIG. 4) forming at least in part a profile of the respective electronic component 304. As configured, the integrated circuits 312 provide each electronic component 304 with an uneven surface, thereby making contact with a substantial portion of the surface of the electronic component 304 infeasible for rigid cooling devices, such as cooling blocks or piping.

Accordingly, as shown in FIGS. 3-5, the cooling apparatus 100 is installed in the computing device 300 in a serpentine shape such that each electronic component 304 is interposed between adjacent containers 102. As arranged, the connectors 124 between each container 102 in the computing device 300 are positioned over the second ends 310 of the electronic components 304 distal the printed circuit board 302 from which the electronic components 304 extend. As shown in FIGS. 3-5, each connector 124 is positioned over a second end 310 of an electronic component 304 in a saddle-like configuration. Although FIG. 3 illustrates each electronic component 304 being in contact with two containers 102, in some examples one or both of the outermost electronic components 304 could be in contact with just one container 102.

The computing device 300 may include a pair of support braces 314 mounted to and extending from the printed circuit board 302 at either end of the cooling apparatus 100. Each support brace 314 provides a counterforce for the electronic component 304 contacting the container 102 at either end of the cooling apparatus 100 to receive adequate compression with the containers 102. As the other containers 102 rely on the electronic component 304 on either side for the countering force during expansion, the electronic components 304 at either end are provided similar counterforce by the support braces 314 to provide conformity to the electronic components 304 on one side.

The cooling apparatus 100 installed in the computing device 300 may form part of a cooling system 316 for the computing device 300. As shown in FIGS. 3-5, the cooling system 316 may include a supply line 318 fluidly coupling one or more inlets 106 of the containers 102 to a coolant source (not shown). The coolant source may be a tank or reservoir containing a supply of coolant. In one or more examples, the coolant may be a liquid, such as water, glycol, or oil. The cooling system 316 may further include a return line 320 fluidly coupled to one or more outlets 108 of the containers 102 and configured to return the coolant to the cooling source or other downstream component. In some examples, the return line 320 may direct the coolant to another server or other computing device downstream from the computing device 300. The supply line 318 and the return line 320 may be part of a closed loop configuration in some examples.

As illustrated in FIGS. 3-5, the cooling system 316 may also include a heat transfer assembly 322 fluidly coupled to each of the supply line 318 and the return line 320. The heat transfer assembly 322 may include a cold plate 324 and an integrated heat spreader 326 coupling the cold plate 324 to the printed circuit board 302. The integrated heat spreader 326 may transfer heat from a CPU or GPU (not shown) mounted to the printed circuit board 302 to the cold plate 324. The cold water supplied from the coolant source in the supply line 318 may cool the water heated by the electronic components 304 in the return line 320 as the supply line 318 and the return line 320 pass through the cold plate 324.

In the cooling system of FIGS. 3-5, the plurality of containers 102 are fluidly coupled to one another in a series relationship. To that end, each outlet 108 of each container 102 is fluidly coupled to the inlet 106 of the adjacent container 102 via a U-shaped conduit 126. In operation, coolant supplied from the coolant source flows through the supply line 318 to an inlet 106 of a container 102 connected to the supply line 318. The coolant flows through the inlet 106 connected to the supply line 318 and into the chamber 122, thereby expanding the container 102. As the container 102 is deformable, the container 102 expands while conforming to the profile of the electronic component 304 in contact with the container 102. The heat generated by the electronic component 304 is transferred to the coolant within the container 102, which is discharged from the container 102 via the outlet 108 to an inlet 106 of an adjacent container 102 via the U-shaped conduit 126. The adjacent container 102 receives the coolant and the process is replicated in each container 102, with the coolant progressively increasing in temperature as the coolant flows through each container 102 in series. At the last container 102 in series, the coolant is discharged from the outlet 108 of the last container 102 to the return line 320 connected to the last outlet 108 in series. The coolant at an elevated temperature is routed via the return line 320 through the cold plate 324 of the heat transfer assembly 322, where heat is removed from the coolant and returned to the coolant source.

Figure 6:
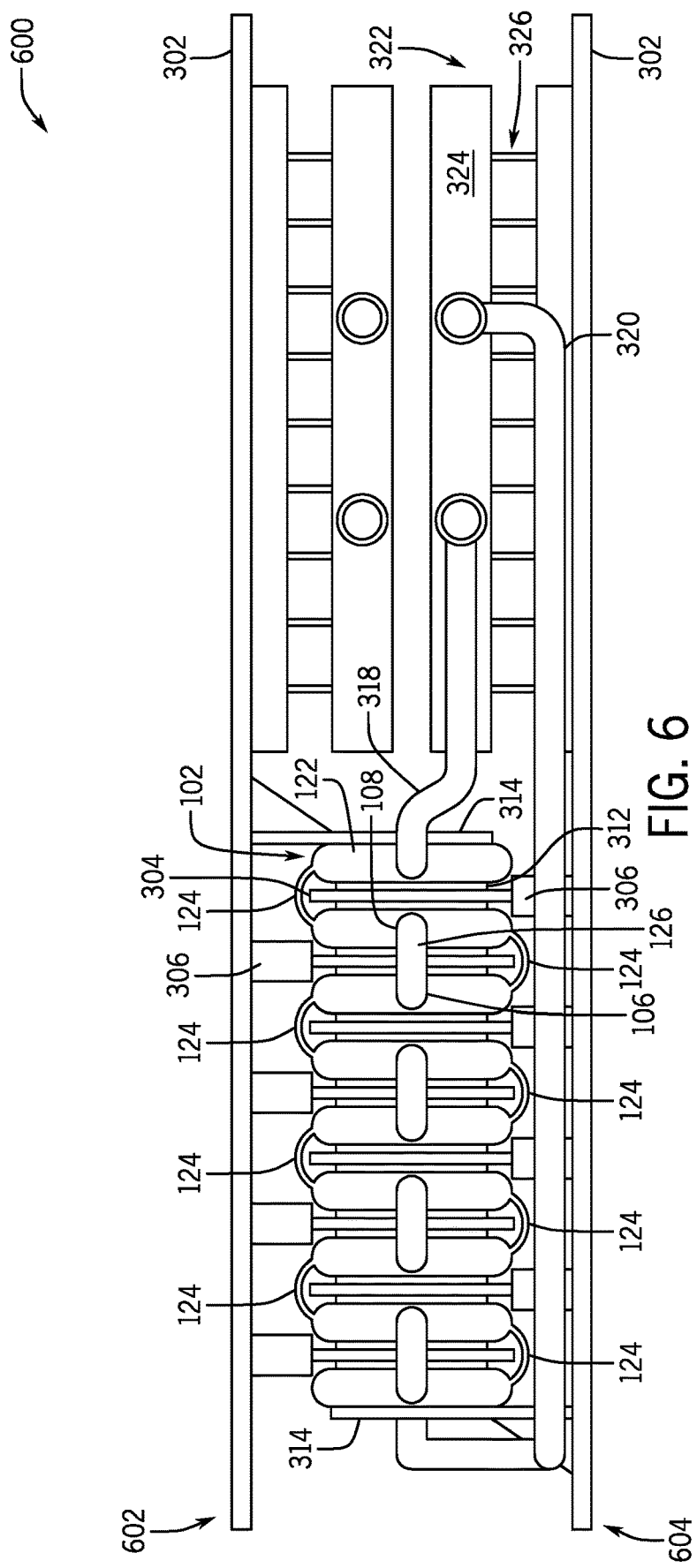
FIG. 6 is a front view of a computing device including the cooling apparatus illustrated in FIG. 1, according to one or more examples of the disclosure.

Referring now to FIG. 6 with continued reference to FIGS. 1 and 3-5, FIG. 6 is a front view of an example computing device 600 including a cooling apparatus installed therein, according to one or more examples of the disclosure. In one or more examples, the computing device 600 may be similar in some respects to the computing device 300 shown in FIGS. 3-5 and may also include the cooling apparatus 100 of FIG. 1, and thus, like numbers will be used to refer to like parts and the discussion of similar features will be omitted for the sake of brevity. The computing device 600 may be twinned server blades including a top server blade 602 and a bottom server blade 604 oriented to face the top server blade 602. The terms "top" and "bottom" as used in reference to the server blades 602, 604 are not intended to limit the server blades 602, 604 to a particular orientation in a server rack (not shown), as those of skill in the art will appreciate that the server blades 602, 604 may be disposed in a side by side relationship in one or more server racks.

The top server blade 602 and the bottom server blade 604 may be identical in the case of twinned server blades and may each include a printed circuit board 302 and a plurality of electronic components 304 coupled to the printed circuit board 302 and extending therefrom. As illustrated in FIG. 6, the electronic components 304 are a plurality of DIMMs coupled to the printed circuit board 302 via respective connecting members 306. The electronic components 304 may extend from the printed circuit board 302 of the top server blade 602 and may be interleaved with the electronic components 304 extending from the printed circuit board 302 of the bottom server blade 604.

As shown in FIG. 6, the cooling apparatus 100 is arranged in a serpentine shape and positioned within the interleaved electronic components 304 such that each electronic component 304 is interposed between adjacent containers 102. As arranged, the connectors 124 between each container 102 in the computing device 600 are positioned over the second ends 310 of the electronic components 304 distal the printed circuit board 302 from which the electronic components 304 extend. As shown in FIG. 6, each connector 124 is positioned over a second end 310 of an electronic component 304 in a saddle-like configuration.

Figure 7:
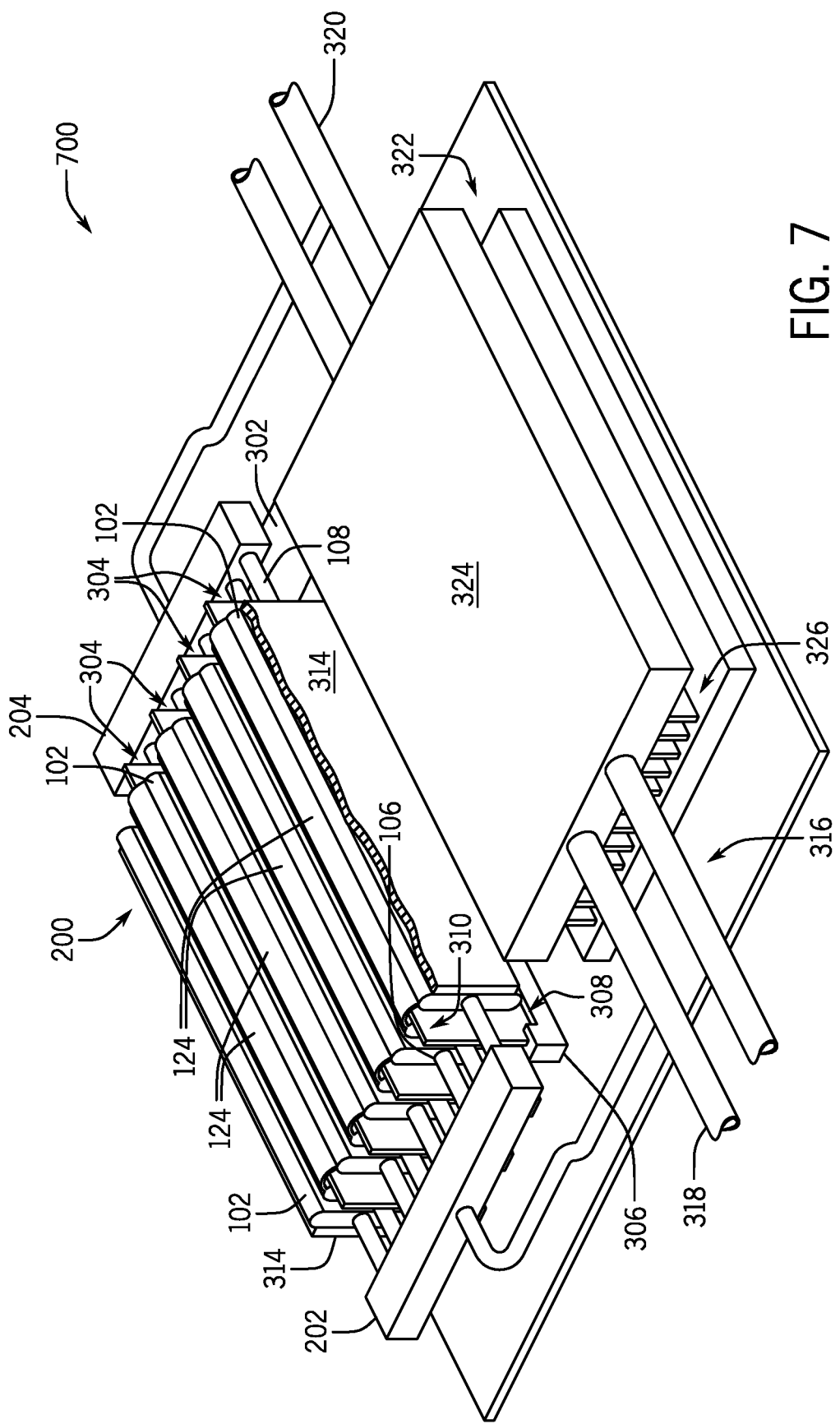
FIG. 7 is an isometric view of a computing device including the cooling apparatus illustrated in FIG. 2, according to one or more examples of the disclosure.
Figure 8:
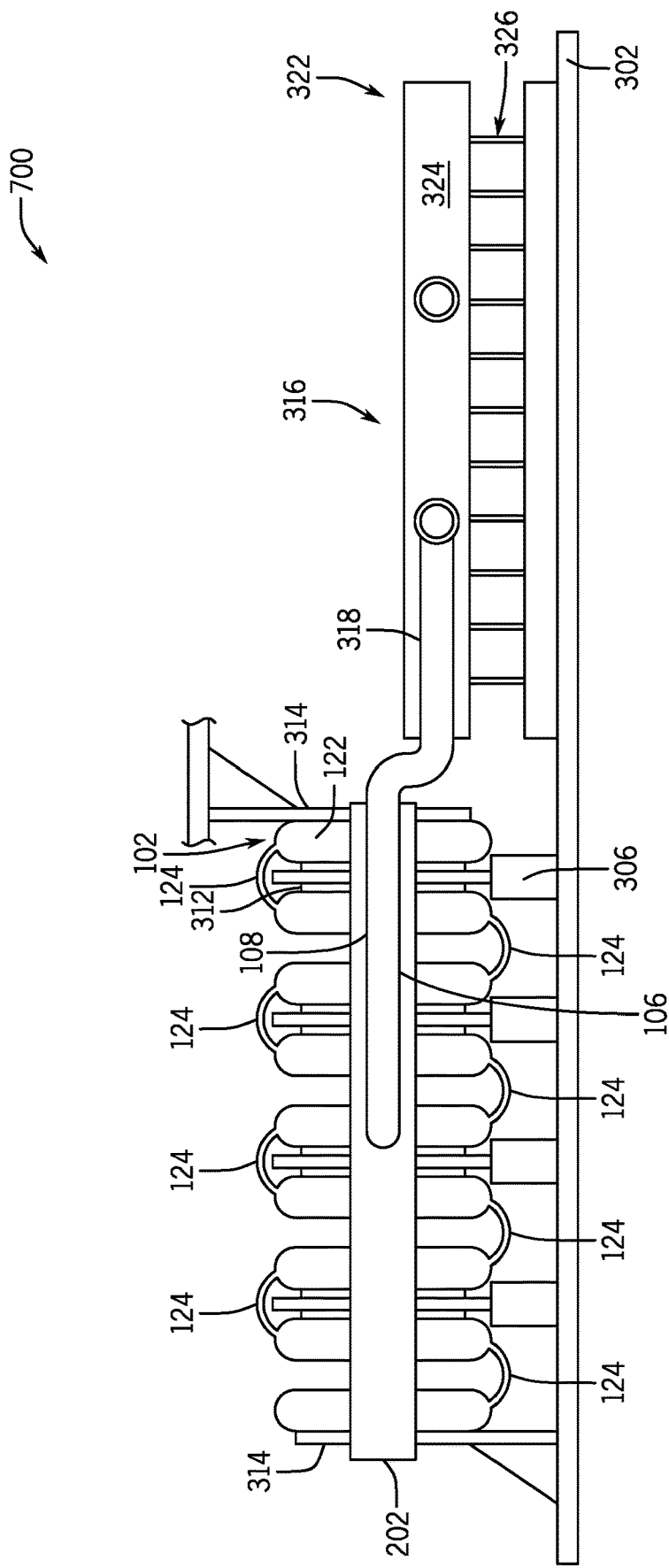
FIG. 8 is a front view of the computing device of FIG. 6, according to one or more examples of the disclosure.
Figure 9:
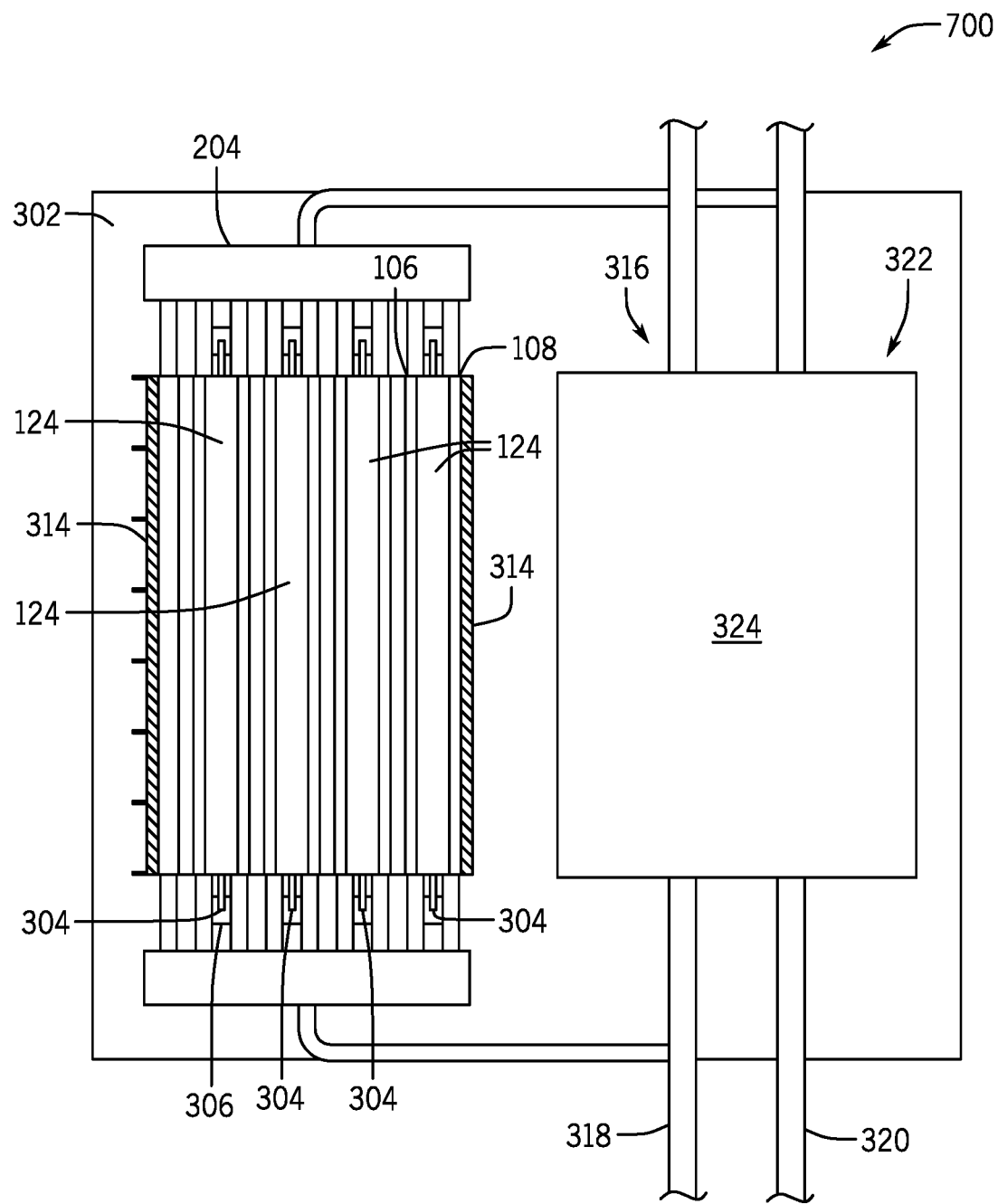
FIG. 9 is a plan view of the computing device of FIG. 6, according to one or more examples of the disclosure.

Referring now to FIGS. 7-9 with reference to FIGS. 2-5, FIGS. 7-9 are respective isometric, front, and plan views of an example computing device 700 including a cooling apparatus installed therein, according to one or more examples of the disclosure. In one or more examples, the computing device 700 may be similar in some respects to the computing device 300 shown in FIGS. 3-5 and may include the cooling apparatus 200 illustrated in FIG. 2, and thus, like numbers will be used to refer to like parts and the discussion of similar features will be omitted for the sake of brevity. In the cooling apparatus 200 of FIGS. 7-9, the plurality of containers 102 are fluidly coupled to one another in a parallel relationship.

To that end, the cooling apparatus 200 includes an inlet manifold 202 fluidly coupled to each of the inlets 106 and the supply line 318, and an outlet manifold 204 fluidly coupled to each of the outlets 108 and the return line 320, such that the plurality of containers 102 are in parallel with one another. In operation, coolant supplied from the coolant source flows through the supply line 318 to the inlet manifold 202. In the inlet manifold 202, the coolant is distributed to each of the inlets 106 of the respective containers 102 fluidly coupling the inlet manifold 202 and the containers 102. The coolant flows through each inlet 106 and into the chamber 122, thereby expanding the container 102. As the container 102 is deformable, the container 102 expands while conforming to the profile of the electronic component 304 in contact with the container 102. The heat generated by the electronic component 304 is transferred to the coolant within the container 102, which is discharged from the container 102 via the outlet 108 to the outlet manifold 204. The outlet manifold 204 channels the coolant discharged from the outlets 108 to the return line 320 fluidly coupled to the outlet manifold 204. The coolant at an elevated temperature is routed via the return line 320 through the cold plate 324 of the heat transfer assembly 322, where heat is removed from the coolant and returned to the coolant source.

Figure 10:
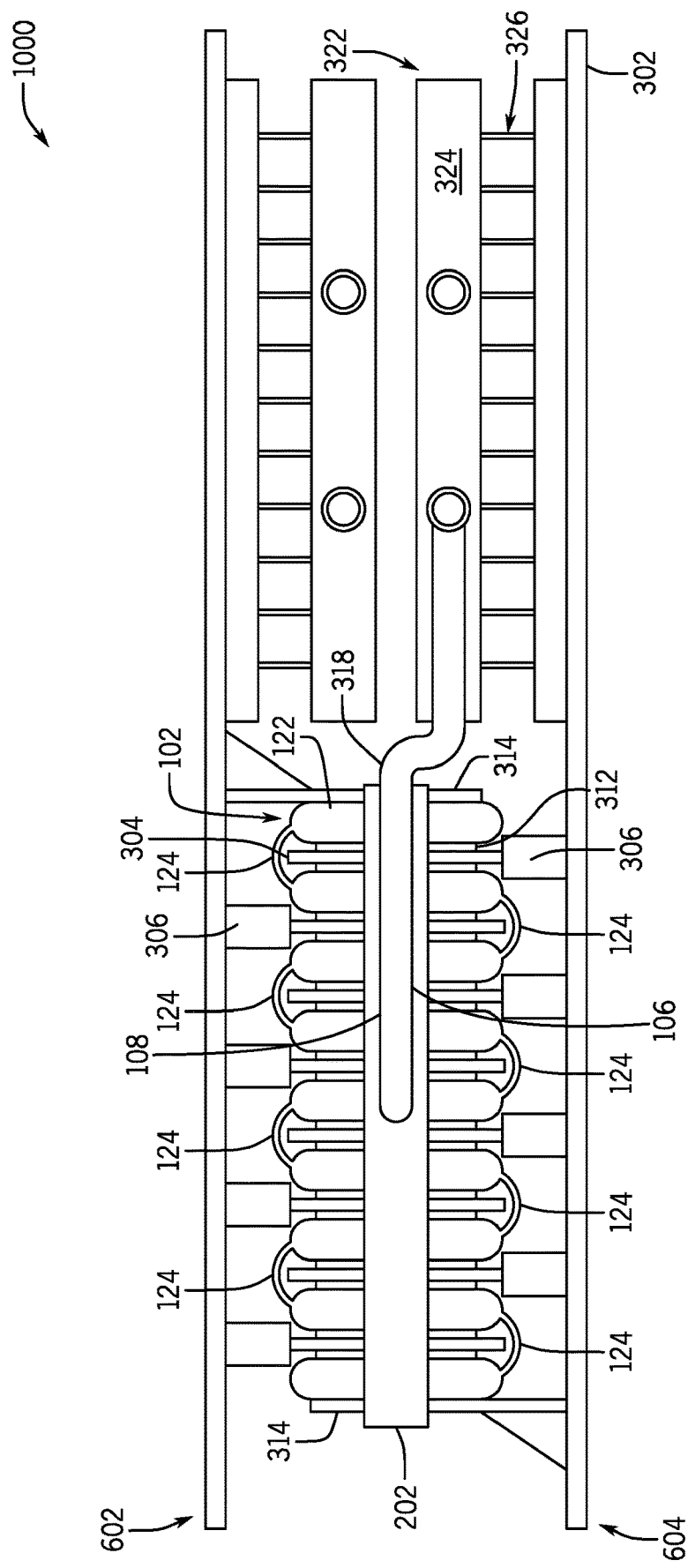
FIG. 10 is a front view of a computing device including the cooling apparatus illustrated in FIG. 2, according to one or more examples of the disclosure.

Referring now to FIG. 10 with continued reference to FIGS. 2-9, FIG. 10 is a front view of an example computing device 1000 including a cooling apparatus installed therein, according to one or more examples of the disclosure. In one or more examples, the computing device 1000 may be similar in some respects to the computing device 600 shown in FIG. 6 and may also include the cooling apparatus 200 of FIG. 2, and thus, like numbers will be used to refer to like parts. The computing device 1000 may be twinned server blades including a top server blade 602 and a bottom server blade 604 oriented to face the top server blade 602.

The top server blade 602 and the bottom server blade 604 may be identical in the case of twinned server blades and may each include a printed circuit board 302 and a plurality of electronic components 304 coupled to the printed circuit board 302 and extending therefrom. As illustrated in FIG. 10, the electronic components 304 are a plurality of DIMMs coupled to the printed circuit board 302 via respective connecting members 306. The electronic components 304 may extend from the printed circuit board 302 of the top server blade 602 and may be interleaved with the electronic components 304 extending from the printed circuit board 302 of the bottom server blade 604.

As shown in FIG. 10, the cooling apparatus 200 is arranged in a serpentine shape and positioned within the interleaved electronic components 304 such that each electronic component 304 is interposed between adjacent containers 102. As arranged, the connectors 124 between each container 102 in the computing device 1000 are positioned over the second ends 310 of the electronic components 304 distal the printed circuit board 302 from which the electronic components 304 extend. As shown in FIG. 10, each connector 124 is positioned over a second end 310 of an electronic component 304 in a saddle-like configuration.

Figure 11:
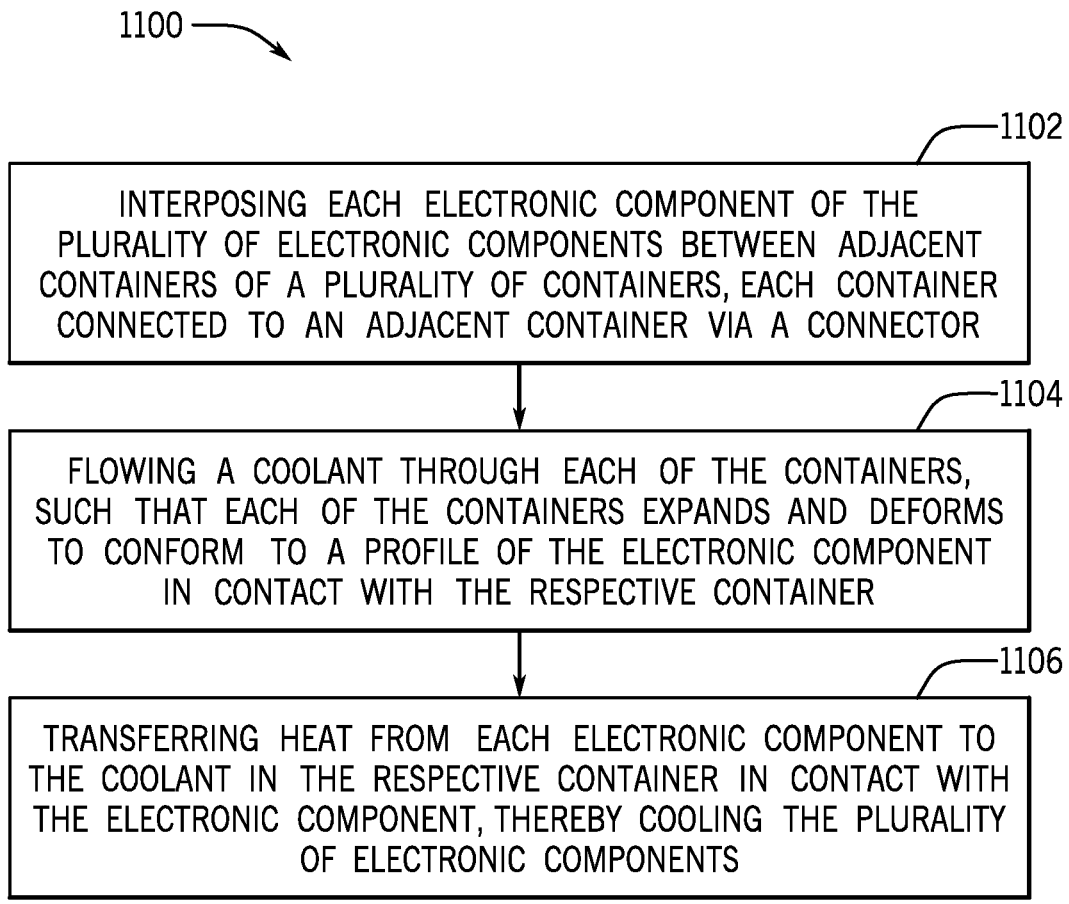
FIG. 11 is a flowchart depicting a method for cooling a plurality of electronic components of a computing device, according to one or more examples of the disclosure.

FIG. 11 is a flowchart depicting a method 1100 for cooling a plurality of electronic components of a computing device, according to one or more examples of the disclosure. In discussing FIG. 11, reference is made to the cooling apparatus 100 and systems of FIGS. 1 and 3-5 to provide contextual examples. Implementation, however, is not limited to those examples. The method 1100 may include interposing each electronic component 304 of the plurality of electronic components 304 between adjacent containers 102 of a plurality of containers 102, as at block 1102. Each container 102 may be connected to an adjacent container 102 via a connector. The method 1100 may also include flowing a coolant through each of the containers 102, such that each of the containers 102 expands and deforms to conform to a profile of the electronic component 304 in contact with the respective container 102, as at block 1104.

The method 1100 may further include transferring heat from each electronic component 304 to the coolant in the respective container 102 in contact with the electronic component 304, thereby cooling the plurality of electronic components 304, as at block 1106.

In one or more examples, the plurality of containers 102 may include a first container and a second container adjacent to the first container. In the method 1100, flowing a coolant through each of the containers 102 further may include flowing the coolant from the outlet of the first container to the inlet of the second container via a conduit 126 coupling the outlet 108 of the first container and the inlet 106 of the second container, such that the plurality of containers 102 are communicably connected in series with one another.

In one or more examples, the method 1100 may also include feeding the coolant from a coolant source to the plurality of containers 102 via a supply line 318 and an inlet manifold 202, the supply line 318 extending between the coolant source and the inlet manifold 202, and the inlet manifold 202 connected to each inlet 106 of the plurality of containers 102. The method 1100 may further include discharging the coolant from the plurality of containers 102 to a return line 320 fluidly coupled to the plurality of containers 102 via an outlet manifold 204, the outlet manifold 204 coupled to each outlet 108 of the plurality of containers 102, such that the plurality of containers 102 are in parallel with one another.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A computing device comprising:
   a first printed circuit board;
   a first plurality of electronic components operably connected to and extending from the first printed circuit board, each electronic component comprising a first end adjacent the first printed circuit board and a second end distal the first printed circuit board;
   a cooling apparatus to cool the first plurality of electronic components, the cooling apparatus comprising:
      a plurality of containers positioned in the computing device such that each electronic component to be cooled is interposed between adjacent containers, each container comprising:
         a body comprising a first end and a second end and defining a chamber through which a coolant is to flow, the body being expandable responsive to pressure from the coolant and deformable responsive to contacting one of the electronic components so as to conform to a profile of the electronic component;
         an inlet disposed at the first end of the body through which the coolant enters the chamber; and
         an outlet disposed at the second end of the body through which the coolant exits the chamber; and
      a plurality of connectors, each connector connecting adjacent containers of the plurality of containers;
   a second printed circuit board in parallel with the first printed circuit board;
   a second plurality of electronic components operably connected to and extending from the second printed circuit board such that:
      the first plurality of electronic components are interleaved with the second plurality of electronic components, and
      each electronic component of the second plurality of electronic components is interposed between adjacent containers of the plurality of containers.

2. The computing device of claim 1, wherein the cooling apparatus forms a serpentine shape within the computing device.

3. The computing device of claim 1, wherein each connector is positioned over a respective second end of the first plurality of electronic components.

4. The computing device of claim 1, wherein the first plurality of electronic components include one or more dual inline memory modules (DIMMs).

5. The computing device of claim 1, wherein the cooling apparatus further comprises:
   a plurality of conduits, each conduit connecting the inlet of one container of the plurality of containers to the outlet of an adjacent container of the plurality of containers such that the respective chambers of the plurality of containers are communicably connected in series with one another.

6. The computing device of claim 1, wherein the cooling apparatus further comprises:
   an inlet manifold to connect to a supply line for the coolant, the inlet manifold connected to the respective inlets of the plurality of containers; and
   an outlet manifold to connect to a return line for the coolant, the outlet manifold connected to the respective outlets of the plurality of containers, such that the respective chambers of the plurality of containers are communicably connected in parallel with one another.

7. The computing device of claim 1, wherein the cooling apparatus further comprises:
   a plurality of conduits, each conduit connecting the inlet of one container of the plurality of containers to the outlet of an adjacent container of the plurality of containers such that the plurality of containers are communicably connected in series with one another.

8. The computing device of claim 1, wherein the cooling apparatus further comprises:
   an inlet manifold to connect to a supply line for the coolant, the inlet manifold connected to the respective inlets of the plurality of containers; and
   an outlet manifold to connect to a return line for the coolant, the outlet manifold connected to the respective outlets of the plurality of containers, such that the plurality of containers are communicably connected in parallel with one another.

* * * * *